United States Patent
Kamibaba et al.

(10) Patent No.: US 9,871,109 B2
(45) Date of Patent: Jan. 16, 2018

(54) SEMICONDUCTOR DEVICE

(71) Applicant: Mitsubishi Electric Corporation, Tokyo (JP)

(72) Inventors: Ryu Kamibaba, Tokyo (JP); Kensuke Taguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/220,007

(22) Filed: Mar. 19, 2014

(65) Prior Publication Data

US 2015/0102452 A1 Apr. 16, 2015

(30) Foreign Application Priority Data

Oct. 10, 2013 (JP) .................... 2013-212639

(51) Int. Cl.
*H01L 29/06* (2006.01)
*H01L 29/78* (2006.01)
(Continued)

(52) U.S. Cl.
CPC .......... *H01L 29/402* (2013.01); *H01L 29/063* (2013.01); *H01L 29/0661* (2013.01);
(Continued)

(58) Field of Classification Search
CPC ... H01L 29/402; H01L 29/404; H01L 29/405; H01L 29/408; H01L 29/7395;
(Continued)

(56) References Cited

U.S. PATENT DOCUMENTS 6,620,691 B2 * 9/2003 Hshieh et al. ................ 438/270
8,994,141 B2 3/2015 Takahashi et al.
(Continued)

FOREIGN PATENT DOCUMENTS

CN 102044559 A 5/2011
JP 2009-099863 A 5/2009
(Continued)

OTHER PUBLICATIONS

The first Office Action issued by the Korean Patent Office dated Jul. 20, 2015, which corresponds to Korean Patent Application No. 10-2014-0057576 and is related to U.S. Appl. No. 14/220,007; with English language partial translation.
(Continued)

*Primary Examiner* — Natalia Gondarenko
(74) *Attorney, Agent, or Firm* — Studebaker & Brackett PC

(57) ABSTRACT

A semiconductor device according to the present invention includes, in a termination region, a p− type breakdown voltage holding region that is an impurity region formed in a predetermined depth direction from a substrate surface of an n− type substrate, a first insulating film formed on the n− type substrate so as to cover at least the p− type breakdown voltage holding region, a first field plate formed on the first insulating film, a second insulating film formed so as to cover the first field plate and the first insulating film, and a second field plate formed on the second insulating film. The first insulating film is thicker in a corner portion than in an X-direction straight portion and a Y-direction straight portion.

6 Claims, 7 Drawing Sheets

(51) Int. Cl.
*H01L 29/66* (2006.01)
*H01L 29/40* (2006.01)
*H01L 29/739* (2006.01)
*H01L 29/08* (2006.01)
*H01L 29/861* (2006.01)

(52) U.S. Cl.
CPC ...... *H01L 29/404* (2013.01); *H01L 29/66333* (2013.01); *H01L 29/66712* (2013.01); *H01L 29/7395* (2013.01); *H01L 29/7811* (2013.01); *H01L 29/0638* (2013.01); *H01L 29/0696* (2013.01); *H01L 29/8611* (2013.01)

(58) Field of Classification Search
CPC ........... H01L 29/7811; H01L 29/41741; H01L 29/42368; H01L 29/872; H01L 27/04; H01L 27/088; H01L 27/12; H01L 21/04; H01L 21/20; H01L 21/761; H01L 29/02; H01L 29/06; H01L 29/0634; H01L 29/0692; H01L 29/0886; H01L 29/66719; H01L 29/7393; H01L 29/78; H01L 29/7827; H01L 29/8083; H01L 29/861; H01L 29/0619–29/0623; H01L 29/7823; H01L 29/66333; H01L 29/66712; H01L 29/0661; H01L 29/63; H01L 29/0696; H01L 29/8611; H01L 29/8613; H01L 29/0615; H01L 29/063; H01L 29/0638
USPC ...... 257/488, 495, 492, 493, 76, 77, E21.54, 257/E21.544, E29.002, E29.009, E21.04, 257/E29.005, 490, 496; 438/478, 425, 438/433

See application file for complete search history.

(56) References Cited

U.S. PATENT DOCUMENTS

| | | | |
|---|---|---|---|
| 9,048,085 B2 | 6/2015 | Senoo | |
| 9,349,811 B2 | 5/2016 | Takahashi | |
| 9,431,479 B2 | 8/2016 | Honda et al. | |
| 2005/0161761 A1* | 7/2005 | Hatade | 257/487 |
| 2008/0179672 A1* | 7/2008 | Hirler et al. | 257/342 |
| 2010/0252904 A1 | 10/2010 | Takahashi et al. | |
| 2011/0084354 A1* | 4/2011 | Honda et al. | 257/493 |
| 2011/0108911 A1* | 5/2011 | Matsuoka | 257/330 |
| 2011/0220914 A1* | 9/2011 | Fujii | H01L 29/063 257/77 |
| 2011/0233715 A1 | 9/2011 | Nabazaki | |
| 2013/0161645 A1 | 6/2013 | Takahashi | |
| 2013/0214394 A1 | 8/2013 | Senoo | |
| 2013/0341751 A1* | 12/2013 | Ono | H01L 23/58 257/488 |
| 2014/0027819 A1* | 1/2014 | Guan | H01L 29/0634 257/202 |
| 2015/0194482 A1 | 7/2015 | Takahashi et al. | |
| 2016/0260826 A1 | 9/2016 | Takahashi | |

FOREIGN PATENT DOCUMENTS

| | | | | |
|---|---|---|---|---|
| JP | 2009-164486 A | 7/2009 | | |
| JP | 2010-245281 A | 10/2010 | | |
| JP | 2011199223 A | * 10/2011 | ............. | H01L 29/78 |
| JP | 2012-244071 A | 12/2012 | | |
| JP | 2013-135062 A | 7/2013 | | |
| JP | 2013-172088 A | 9/2013 | | |
| KR | 2010-0111235 A | 10/2010 | | |
| KR | 2013-0062317 A | 6/2013 | | |

OTHER PUBLICATIONS

An Office Action; "Decision of Refusal," issued by the Korean Patent Office dated Jan. 25, 2016, which corresponds to Korean Patent Application No. 10-2014-0057576 and is related to U.S. Appl. No. 14/220,007; with English language partial translation.

An Office Action issued by SIPO dated Jan. 24, 2017, which corresponds to Chinese Patent Application No. 201410225111.2 and is related to U.S. Appl. No. 14/220,007; with partial English language translation.

An Office Action; "Notification of Reason(s) for Refusal" issued by the Japanese Patent Office dated Dec. 20, 2016, which corresponds to Japanese Patent Application No. 2013-212639 and is related to U.S. Appl. No. 14/220,007; with English language partial translation.

An Office Action; "Notification of Reasons for Refusal" issued by the Japanese Patent Office dated Mar. 14, 2017, which corresponds to Japanese Patent Application No. 2013-212639 and is related to U.S. Appl. No. 14/220,007; with English language translation.

\* cited by examiner

F I G. 4
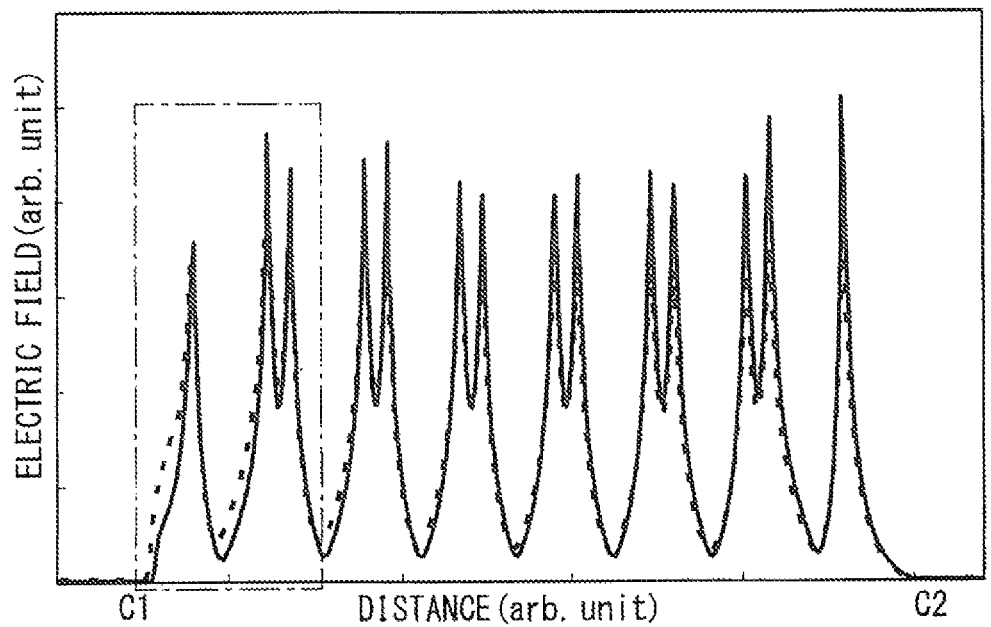
F I G. 5
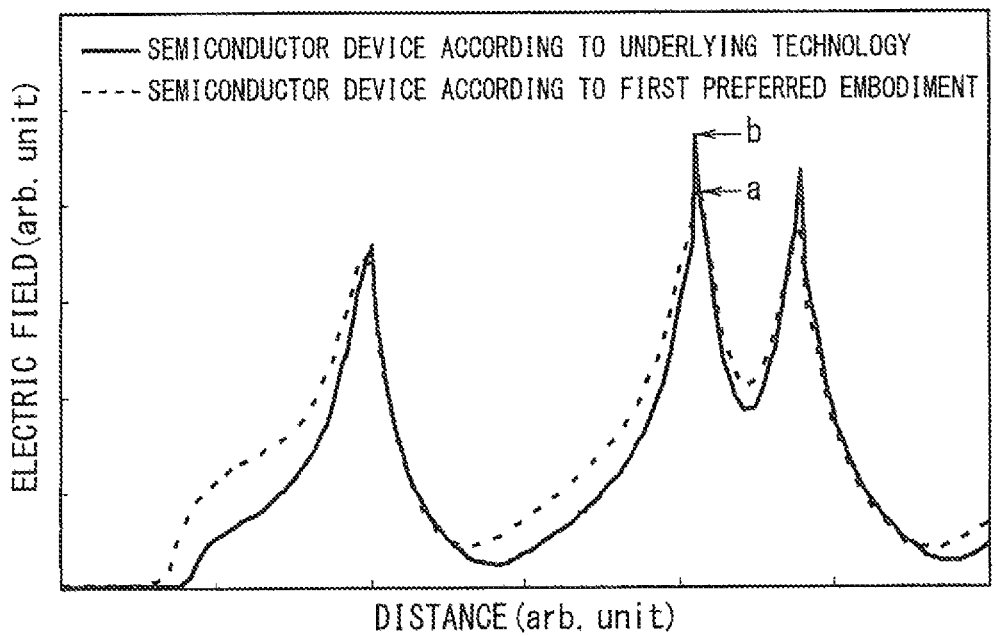

F I G. 6
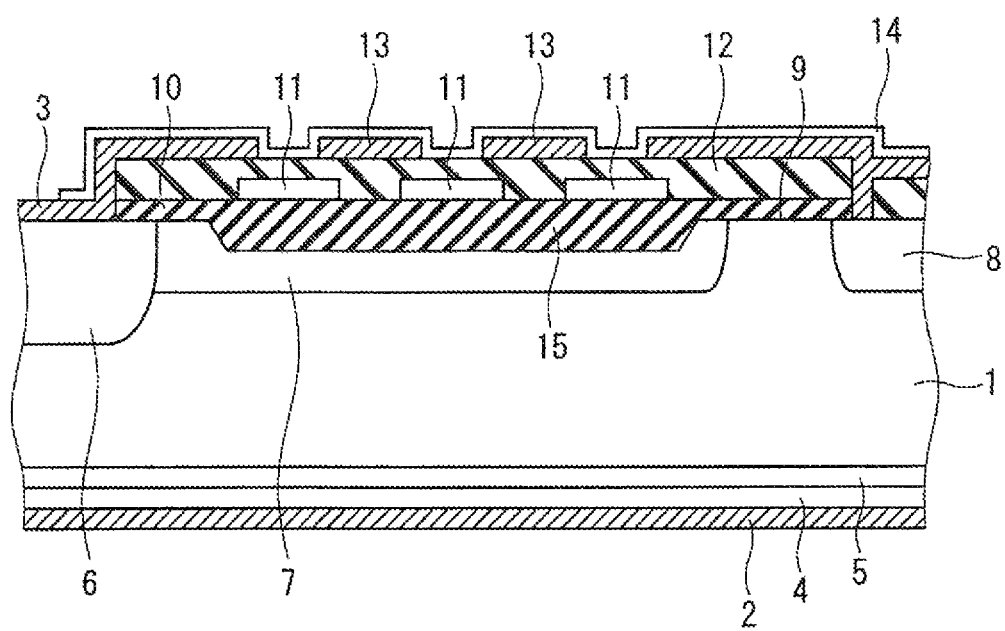

SEMICONDUCTOR DEVICE

BACKGROUND OF THE INVENTION

Field of the Invention

The present invention relates to a semiconductor device having a termination region for electric power conversion.

Description of the Background Art

Power devices, which are semiconductor devices for electric power conversion, are widely used in various fields from home electric appliances, electric vehicles, railroads, to attention-getting renewable energy, such as photovoltaic power generation and wind power generation. In such fields, power devices or power electronics apparatuses equipped with the power devices are used for conversion of electric power energy. Higher performance, such as reduction in size and higher efficiency, has been desired.

A power device includes an element region provided in a center of a chip and a termination region provided in a peripheral portion of the element region. The element region primarily passes electric current. The termination region has a breakdown voltage. Although the termination region serves as a region for determining a breakdown voltage characteristic that is one of important characteristics of the power device, it is desirable to design the termination region as small as possible to make a smaller chip because the termination region is inactive while energized.

In order to satisfy the above-described requirements, some power devices have begun employing a reduced surface field (RESURF) structure and a variation of lateral doping (VLD) structure that allow the termination region to be smaller than that of a guard ring (GR) structure generally used until now.

The termination region provided in the power chip includes a straight portion and a corner portion. When the straight portion and the corner portion are designed with common structure, the nature of the corner portion having a curvature causes a problem that an electric field concentrates more easily in the corner portion than in the straight portion.

Various structures for relaxing concentration of the electric field in the corner portion have conventionally been proposed to solve the above-described problem. For example, a structure is disclosed to relax concentration of the electric field in the corner portion by making a breakdown voltage holding region formed in the corner portion wider than the breakdown voltage holding region formed in the straight portion (that is, by enlarging an area of the corner portion in the termination region). (For example, refer to Japanese Patent Application Laid-Open No. 2009-164486.)

SUMMARY OF THE INVENTION

The structure disclosed in Japanese Patent Application Laid-Open No. 2009-164486 is applicable when nothing is mounted outside the corner portion (opposite to the element region of the corner portion). However, for example, when an identification mark indicating information about the semiconductor device or a control pattern for controlling a semiconductor process condition are already disposed outside the corner portion, there arises a problem of failure to apply the termination region with the wider breakdown voltage holding region formed in the corner portion.

An object of the present invention is to provide a semiconductor device capable of improving breakdown voltage performance without enlarging an area of the termination region.

A semiconductor device includes a termination region provided so as to surround an element region in plan view, the termination region having a straight portion and a corner portion. The semiconductor device includes, in the termination region: a breakdown voltage holding region formed in a predetermined depth direction from a surface of a first conductivity-type substrate, the breakdown voltage holding region being a second conductivity-type low-concentration impurity region; a first insulating film on the substrate, the first insulating film formed so as to cover at least the breakdown voltage holding region; a first field plate formed on the first insulating film; a second insulating film formed so as to cover the first field plate and the first insulating film; and a second field plate formed on the second insulating film. The first insulating film is thicker in the corner portion than in the straight portion.

The semiconductor device according to the present invention includes, in the termination region: the breakdown voltage holding region formed in the predetermined depth direction from the surface of the first conductivity-type substrate, the breakdown voltage holding region being the second conductivity-type low-concentration impurity region; the first insulating film on the substrate, the first insulating film formed so as to cover at least the breakdown voltage holding region; the first field plate formed on the first insulating film; the second insulating film formed so as to cover the first field plate and the first insulating film; and the second field plate formed on the second insulating film. The first insulating film is thicker in the corner portion than in the straight portion. Therefore, the breakdown voltage performance of the semiconductor device may be improved without enlarging the area of the termination region.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 and 5 are diagrams each schematically illustrating an example of an electric field distribution in a corner portion of a termination region of the semiconductor device according to the first preferred embodiment of the present invention;

FIG. 6 is a cross-sectional view illustrating an example of the configuration of the semiconductor device according to a second preferred embodiment of the present invention;

DESCRIPTION OF THE PREFERRED EMBODIMENTS

Preferred embodiments of the present invention will be described below with reference to the drawings.

Hereinafter, symbols of "+" and "−" denote that an n type or p type impurity concentration is a relatively high concentration (+) or low concentration (−).

The description below refers to the n type as a first conductivity type, and the p type as a second conductivity type.

An insulated gate bipolar transistor (IGBT) having a RESURF structure will be described as an example of the semiconductor device.

<Underlying Technology>

First, a technology underlying the present invention (an underlying technology) will be described.

Figure 11:
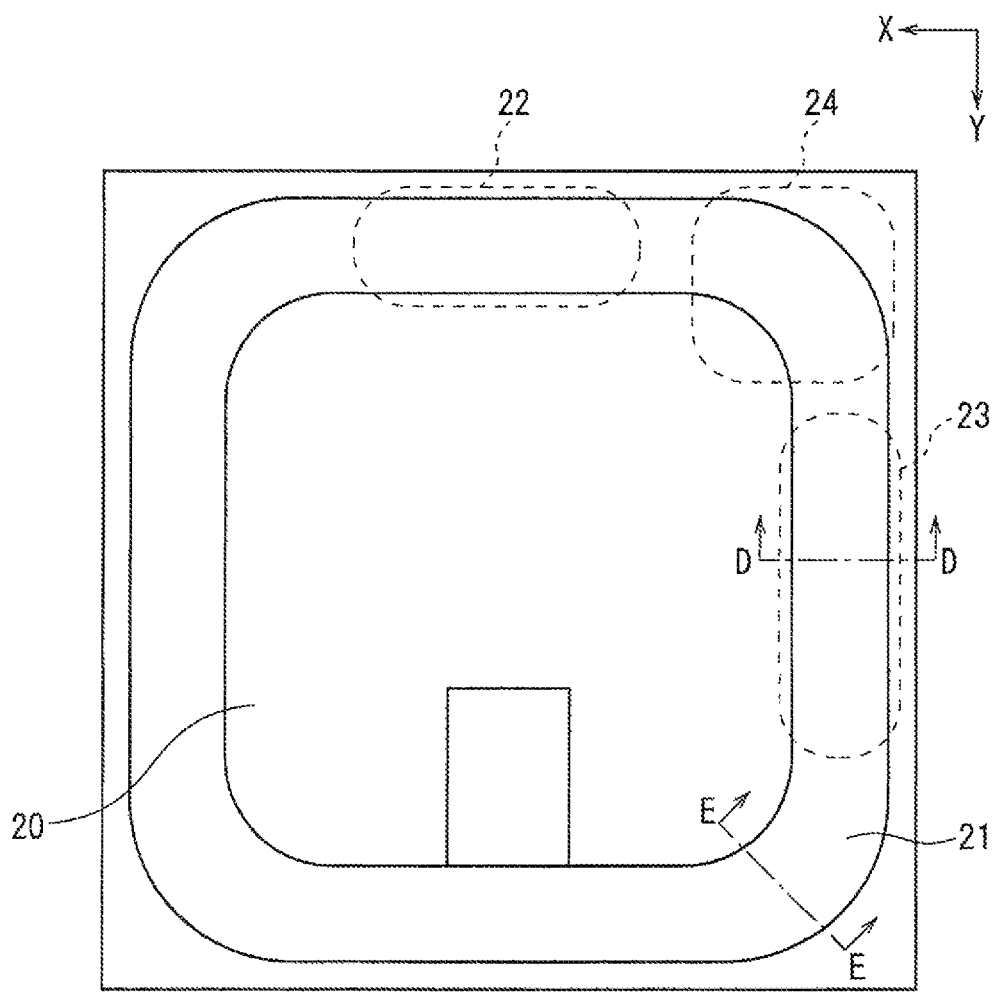
FIG. 11 is a plan view illustrating an example of the configuration of the semiconductor device according to an underlying technology.

FIG. 11 is a plan view illustrating an example of a configuration of a semiconductor device according to the underlying technology.

As illustrated in FIG. 11, the semiconductor device has an element region 20 provided in a central portion of a chip and a termination region 21 provided in a peripheral portion of the element region 20 (so as to surround the element region 20 in plan view).

The termination region 21 has a straight portion including an X-direction straight portion 22 and a Y-direction straight portion 23, and a corner portion 24 that connects the X-direction straight portion 22 and the Y-direction straight portion 23.

Figure 12:
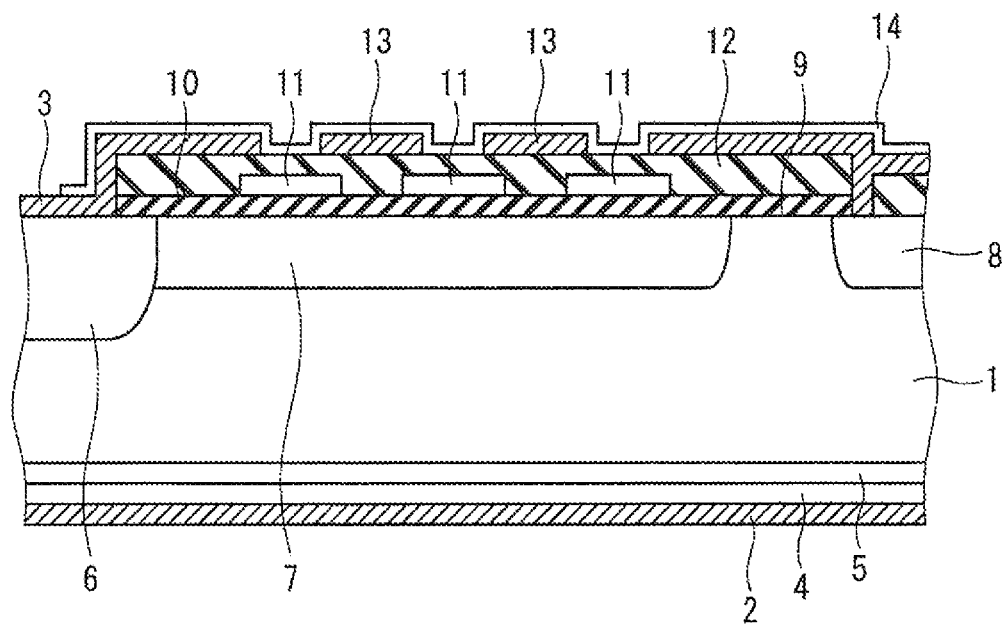
FIGS. 12 and 13 are cross-sectional views each illustrating an example of the configuration of the semiconductor device according to the underlying technology.
Figure 13:
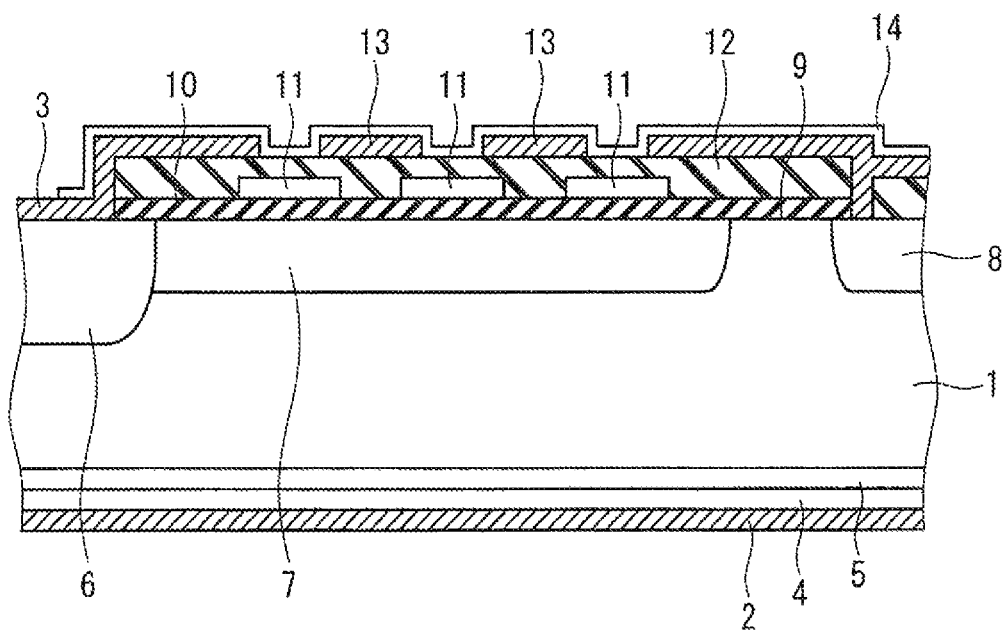

FIG. 12 is a cross-sectional view illustrating an example of a configuration taken along a line D-D of FIG. 11, and illustrates the configuration of the cross-section of the Y-direction straight portion 23 of the termination region 21. FIG. 13 is a cross-sectional view illustrating an example of a configuration taken along a line E-E of FIG. 11, and illustrates the configuration of the cross-section of the corner portion 24 of the termination region 21. While FIG. 12 illustrates the configuration of the cross-section of the Y-direction straight portion 23, the configuration of the cross-section of the X-direction straight portion 22 is similar thereto.

As illustrated in FIGS. 12 and 13, the straight portion (the X-direction straight portion 22, the Y-direction straight portion 23) and the corner portion 24 in the termination region 21 have the common configuration.

Specifically, in the termination region 21 according to the underlying technology, a p type well region 6, a p− type breakdown voltage holding region 7, and an n+ type channel stopper region 8 are formed in a direction of a predetermined depth from a substrate surface 9 of an n− type substrate 1.

The p type well region 6 is formed extending from the element region 20 to the termination region 21. A smaller curvature relaxes concentration of an electric field.

The p− type breakdown voltage holding region 7 is formed adjacent to the p type well region 6 at a low concentration that holds a breakdown voltage and at an impurity depth that satisfies the RESURF condition.

The n+ type channel stopper region 8 is formed in an outermost peripheral portion of the termination region 21.

A first insulating film 10, a first field plate 11, a second insulating film 12, a second field plate 13, an emitter electrode 3, and a protective film 14 are formed on the substrate surface 9 of the n− type substrate 1.

The first insulating film 10 is formed so as to cover at least the p− type breakdown voltage holding region 7.

The plurality of first field plates 11 are formed at predetermined intervals on the first insulating film 10.

The second insulating film 12 is formed as an interlayer insulating film so as to cover the first field plate 11 and the first insulating film 10.

The plurality of second field plates 13 are formed at predetermined intervals on the second insulating film 12. The first field plate 11 and the second field plate 13 are formed in a position in which ends of the first field plate 11 and the second field plate 13 overlap in a depth direction. The first field plate 11 and the second field plate 13 have a function to stabilize a potential on the substrate surface 9 of the p− type breakdown voltage holding region 7.

The emitter electrode 3 is formed spaced from the second field plate 13 to cover a portion of the second insulating film 12.

The protective film 14 is formed so as to cover a surface of a portion of the emitter electrode 3, the second insulating film 12, and the second field plate 13.

An n+ type buffer layer 5, a p+ type collector layer 4, and a collector electrode 2 are formed by lamination in this order on a back surface of the n− type substrate 1 (on a surface opposite to the substrate surface 9).

As described above, when the straight portion (the X-direction straight portion 22, the Y-direction straight portion 23) and the corner portion 24 are designed with the common structure, the nature of the corner portion 24 having a curvature causes a problem that the electric field concentrates more easily in the corner portion 24 than in the X-direction straight portion 22 and the Y-direction straight portion 23.

Japanese Patent Application Laid-Open No. 2009-164486 describes a structure with the breakdown voltage holding region formed in the corner portion being wider than the breakdown voltage holding region formed in the straight portion. As described above, however, there is a problem that this structure may not be applied when an identification mark or a control pattern is already disposed.

The present invention has been made to solve the above problems and will be described in detail below.

<First Preferred Embodiment>

Figure 1:
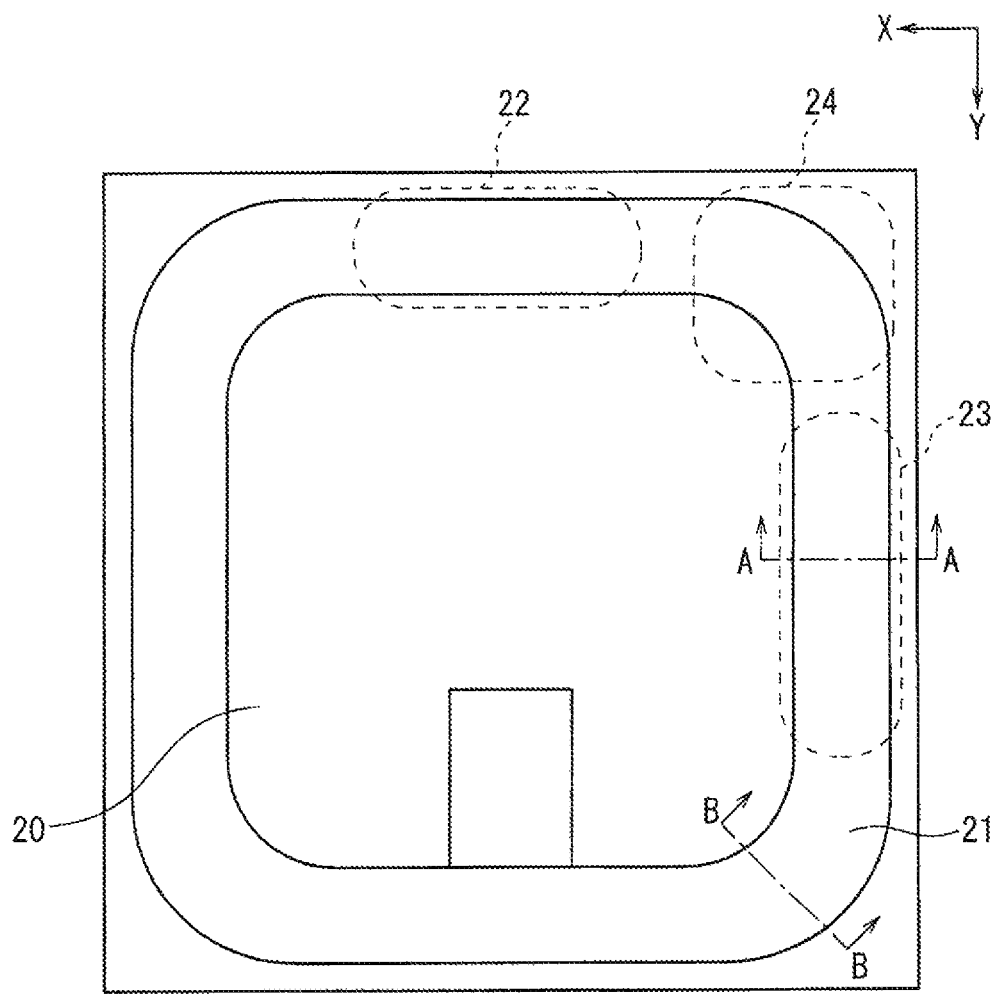
FIG. 1 is a plan view illustrating an example of a configuration of a semiconductor device according to a first preferred embodiment of the present invention.
Figure 2:
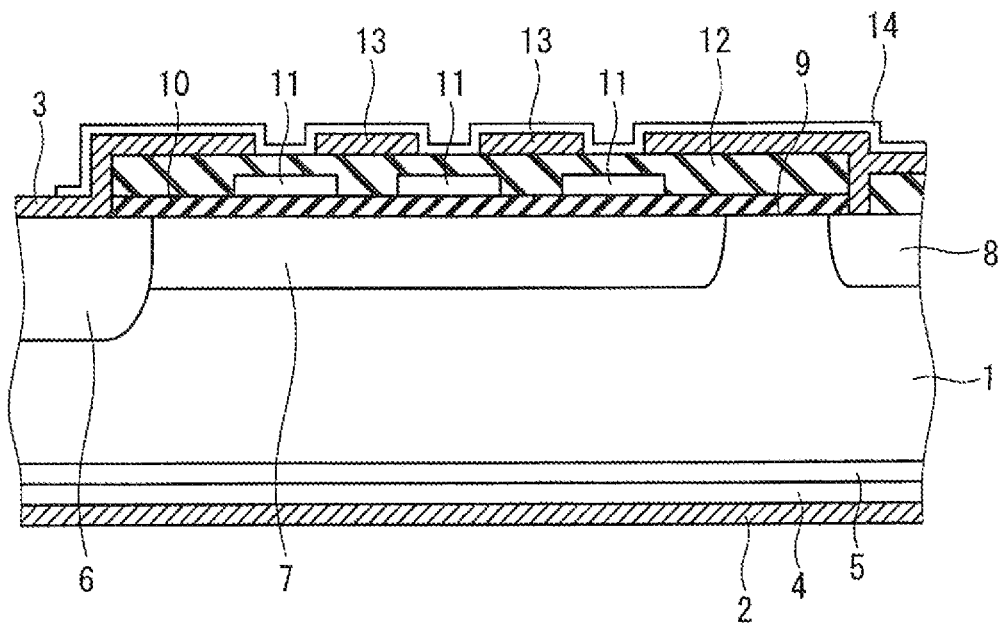
FIGS. 2 and 3 are cross-sectional views each illustrating an example of the configuration of the semiconductor device according to the first preferred embodiment of the present invention.
Figure 3:
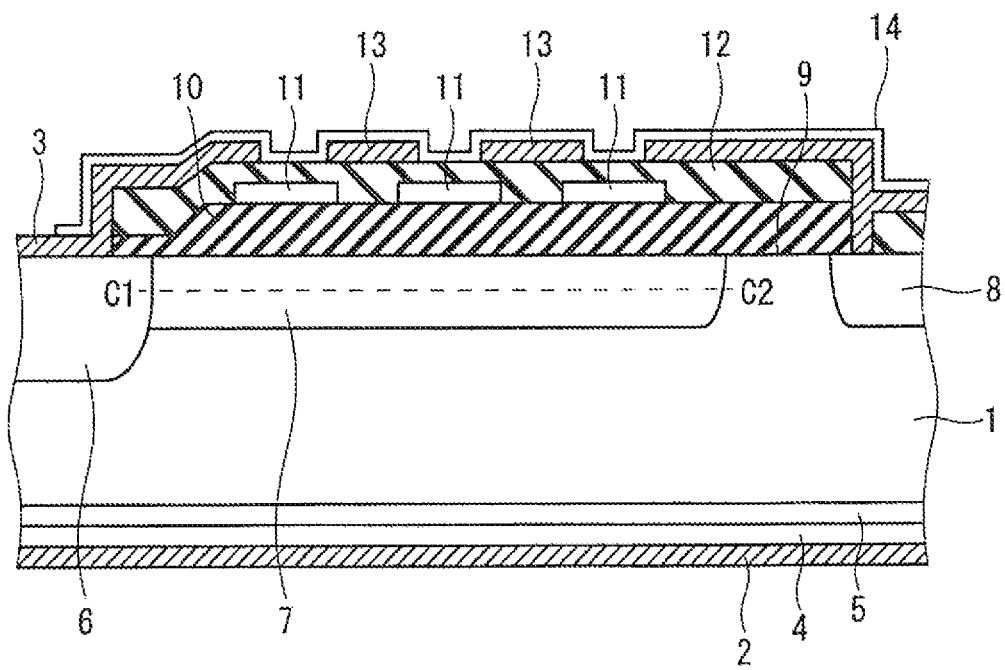

FIG. 1 is a plan view illustrating an example of a configuration of a semiconductor device according to a first preferred embodiment of the present invention. FIG. 2 is a cross-sectional view illustrating an example of a configuration taken along a line A-A of FIG. 1, and illustrates the configuration of the cross-section of a Y-direction straight portion 23 of a termination region 21. FIG. 3 is a cross-sectional view illustrating an example of a configuration taken along a line B-B of FIG. 1, and illustrates the configuration of the cross-section of a corner portion 24 of the termination region 21. While FIG. 2 illustrates the configuration of the cross-section of the Y-direction straight portion 23, a configuration of a cross-section of an X-direction straight portion 22 is similar thereto.

As illustrated in FIGS. 1 to 3, in the semiconductor device according to the first preferred embodiment, the first insulating film 10 formed in the termination region 21 is thicker in the corner portion 24 than in the X-direction straight portion 22 and the Y-direction straight portion 23. Other configurations are similar to those of the underlying technology (refer to FIGS. 11 to 13), and description will be omitted.

In the termination region 21, the application of a positive potential to a collector electrode 2 relative to an emitter electrode 3 causes a depletion layer to be formed extending from an element region 20 to the termination region 21. At this time, a p− type breakdown voltage holding region 7 is completely depleted by controlling and optimizing an impurity concentration in the p− type breakdown voltage holding region 7 in advance so as to obtain a desired breakdown voltage.

An electric field intensity distribution in the depleted p− type breakdown voltage holding region 7 is not uniform. The electric field is higher at a junction between the p type well region 6 and the p− type breakdown voltage holding region 7, and directly under ends of a first field plate 11 and a second field plate 13 (that is, a portion in which the ends of both plates overlap in a depth direction), causing an avalanche breakdown. In particular, the electric field is higher directly under the second field plate 13.

As described above, since the electric field concentrates more easily in the corner portion 24 than in the X-direction straight portion 22 and the Y-direction straight portion 23, the electric field intensity distribution is higher in the p type well region 6 and the p− type breakdown voltage holding region 7. Therefore, the breakdown voltage of the semiconductor device depends on the electric field intensity in the corner portion 24 (in other words, an absolute value of the breakdown voltage depends on the curvature of the corner portion 24).

As illustrated in FIG. 3, in the semiconductor device according to the first preferred embodiment, the first insulating film 10 directly under the second field plate 13 is formed so that the first insulating film 10 is thicker in the corner portion 24 than in the X-direction straight portion 22 and the Y-direction straight portion 23. This configuration allows reduction in a peak value of the electric field intensity directly under the second field plate 13, and relaxation of concentration of the electric field in the corner portion 24. Therefore, the breakdown voltage of the semiconductor device may be improved when the positive potential is applied to the collector electrode 2 relative to the emitter electrode 3.

FIG. 4 is a diagram schematically illustrating an example of an electric field distribution in the corner portion 24 of the termination region 21. FIG. 4 illustrates the electric field distribution along a line C1-C2 of FIG. 3 when the positive potential is applied to the collector electrode 2 relative to the emitter electrode 3. FIG. 5 is an enlarged view of a portion surrounded by an alternate long and short dash line in FIG. 4.

In FIGS. 4 and 5, a horizontal axis represents a distance in a direction of C1-C2, and a vertical axis represents the electric field intensity. A solid line in the diagrams represents the electric field intensity in the semiconductor device according to the underlying technology (refer to FIGS. 11 to 13). A dashed line represents the electric field intensity in the semiconductor device according to the first preferred embodiment (refer to FIGS. 1 to 3).

As illustrated in FIG. 4, a plurality of electric field intensity peaks exist in each of the semiconductor device according to the underlying technology and the semiconductor device according to the first preferred embodiment. Positions where the electric field intensity peaks exist correspond to positions of ends of the second field plate 13. This shows that the electric field concentrates directly under the second field plate 13.

When the peak value of the electric field intensity illustrated in FIGS. 4 and 5 exceeds a dielectric breakdown electric field of a semiconductor material used for the n− type substrate 1 (a dielectric breakdown electric field of silicon when the semiconductor material used for the n− type substrate 1 is silicon), an avalanche breakdown occurs in the semiconductor device. The breakdown voltage value of the semiconductor device is determined at this time. In order to improve the breakdown voltage value, therefore, the electric field intensity peak value needs to be lowered.

As illustrated in FIG. 5, a peak value "a" of the electric field intensity of the semiconductor device according to the first preferred embodiment is smaller than a peak value "b" of the electric field intensity of the semiconductor device according to the underlying technology. The first insulating film 10 in the corner portion 24 is thicker in the semiconductor device according to the first preferred embodiment than in the semiconductor device according to the underlying technology (refer to FIGS. 3 and 13), allowing a rise in the electric field between the second field plates 13. As a result, the electric field intensity peak value may be reduced.

Thus, the first preferred embodiment allows the concentration of the electric field in the corner portion 24 to be relaxed without enlarging an area of the termination region 21, allowing improvement in the breakdown voltage performance of the semiconductor device.

<Second Preferred Embodiment>

FIG. 6 is a cross-sectional view illustrating an example of a configuration taken along a line B-B of FIG. 1, and illustrates the configuration of the cross-section of a corner portion 24 of a termination region 21.

In a second preferred embodiment of the present invention, a substrate surface 9 of an n− type substrate 1 includes a recessed region 15 formed in a recessed shape in the corner portion 24. Other configurations are similar to those in the first preferred embodiment and description will be omitted.

As illustrated in FIG. 6, the formation of the recessed region 15 in the corner portion 24 enables a first insulating film 10 to be thicker in the corner portion 24 than in an X-direction straight portion 22 and a Y-direction straight portion 23. A surface of the first insulating film 10 may be made flush between the corner portion 24 and a straight portion (the X-direction straight portion 22, the Y-direction straight portion 23).

Thus, according to the second preferred embodiment, in addition to an effect of the first preferred embodiment, the semiconductor device in the corner portion 24 and the straight portion (the X-direction straight portion 22, the Y-direction straight portion 23) may be made flatter than in the first preferred embodiment.

<Third Preferred Embodiment>

In a third preferred embodiment of the present invention, a recessed region 15 according to a second preferred embodiment is formed by a local oxidation of silicon (LOCOS) method.

Figure 7:
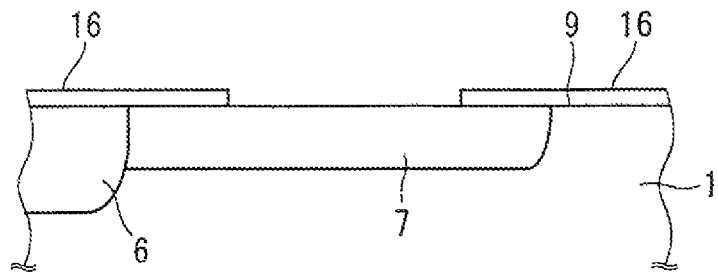
FIGS. 7 to 9 are diagrams each illustrating an example of a manufacturing process of the semiconductor device according to a third preferred embodiment of the present invention.
Figure 8:
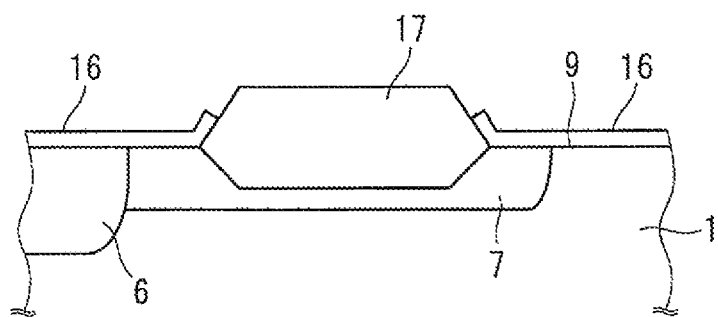
Figure 9:
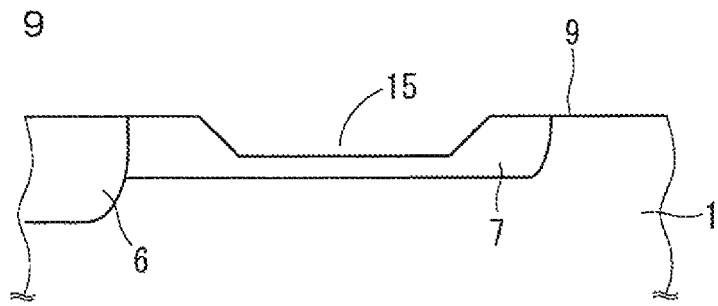

FIGS. 7 to 9 are diagrams each illustrating an example of a manufacturing process of a semiconductor device according to the third preferred embodiment. In particular, FIGS. 7 to 9 each illustrate an example of a process of forming the recessed region 15.

As illustrated in FIG. 7, a nitride film 16 is formed on a substrate surface 9 of an n− type substrate 1 so that a portion of a surface of a p− type breakdown voltage holding region 7 is exposed. In other words, the nitride film 16 is formed so that the portion of the substrate surface 9 in which the recessed region 15 is to be formed is exposed.

Next, as illustrated in FIG. 8, an oxide film 17 having a LOCOS shape is formed by a thermal oxidation process.

Next, as illustrated in FIG. 9, the recessed region 15 is formed by elimination of the nitride film 16 and the oxide film 17.

Thus, according to the third preferred embodiment, in addition to an effect of the second preferred embodiment, the semiconductor device suffers no damage by etching as compared with a case where the recessed region 15 is formed by etching because the recessed region 15 is formed by the LOCOS method. Therefore, a semiconductor device having a stable breakdown voltage performance may be obtained.

<Fourth Preferred Embodiment>

Figure 10:
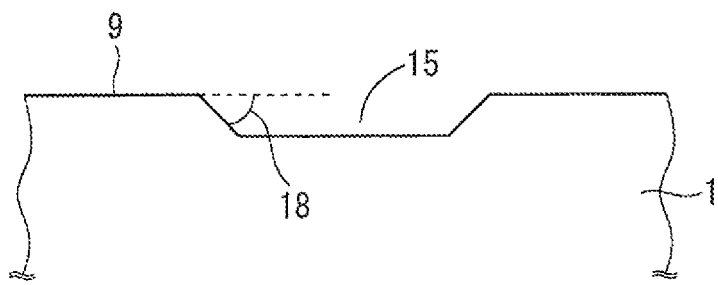
FIG. 10 is a cross-sectional view illustrating an example of the configuration of the semiconductor device according to a fourth preferred embodiment of the present invention.

FIG. 10 is an enlarged view of a peripheral portion of a recessed region 15 illustrated in FIG. 6.

As illustrated in FIG. 10, in a fourth preferred embodiment of the present invention, the recessed region 15 is formed in a tapered shape with an interface with a non-recessed region (a region where the recessed region 15 is not formed) on a substrate surface 9 inclined to the substrate surface 9 at a taper angle 18 of 90 degrees or less. Other configurations are similar to those in the second and third preferred embodiments, and description will be omitted.

Thus, according to the fourth preferred embodiment, an effect similar to that of the second and third preferred embodiments will be obtained.

While the first to fourth preferred embodiments have been described assuming that the semiconductor device is an IGBT, the semiconductor device may be a metal oxide semiconductor field effect transistor (MOSFET) or a diode.

While the first to fourth preferred embodiments have been described assuming that the n type is a first conductivity type and the p type is a second conductivity type, the n type may be the second conductivity type and the p type may be the first conductivity type.

The semiconductor material used for the n− type substrate 1 may be silicon, or may alternatively be other materials such as silicon carbide (SiC), gallium nitride (GaN), and diamond.

Each preferred embodiment of the present invention may freely be combined, and various modifications and exclusions may be made to each preferred embodiment without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising a termination region provided so as to surround an element region in plan view, said termination region having a straight portion and a corner portion, said semiconductor device comprising, in said termination region:
a breakdown voltage holding region formed in a predetermined depth direction from a surface of a first conductivity-type substrate extending along a substrate plane, said breakdown voltage holding region being a second conductivity-type impurity region;
a well region being a second conductivity-type impurity region and extending into said substrate in the predetermined depth direction deeper than said breakdown voltage holding region;
a first insulating film on said substrate, said first insulating film formed so as to cover at least said breakdown voltage holding region, said first insulating film including a single, continuous film surrounding said element region in plan view and including a straight portion and a corner portion, said single, continuous film also including a film thickness in a direction perpendicular to the substrate plane, the film thickness having a maximum extent greater in said corner portion than a maximum extent in said straight portion as viewed from a side view perspective;
first field plates formed on said first insulating film in a single layer;
a second insulating film formed so as to completely cover all top surfaces of said first field plates and said first insulating film; and
second field plates formed on said second insulating film, wherein
all of said first field plates formed in a single layer are electrically floating,
said first insulating film and said second insulating film both extend over a portion of said well region, and
a sum of the film thickness of said first insulating film and a film thickness of said second insulating film in at least a portion of said termination region is larger than a sum of the film thickness of said first insulating film and the film thickness of said second insulating film in said portion of said well region over which both said first insulating film and said second insulating film extend.

2. The semiconductor device according to claim 1, further comprising, in said corner portion, a recessed region with a surface of said substrate formed in a recessed shape,
wherein a surface of said first insulating film is flush between said corner portion and said straight portion.

3. The semiconductor device according to claim 2, wherein said recessed region is formed by a local oxidation of silicon (LOCOS) method.

4. The semiconductor device according to claim 2, wherein said recessed region is formed in a tapered shape with an interface with a non-recessed region inclined 90 degrees or less to said substrate surface.

5. The semiconductor device according to claim 3, wherein said recessed region is formed in a tapered shape with an interface with a non-recessed region inclined 90 degrees or less to said substrate surface.

6. The semiconductor device according to claim 1, wherein said film thickness of said first insulating film has only one extent in said straight portion and multiple extents in said corner portion.

* * * * *